(12) United States Patent
Pillarisetty et al.

(10) Patent No.: US 8,017,933 B2
(45) Date of Patent: Sep. 13, 2011

(54) COMPOSITIONALLY-GRADED QUANTUM-WELL CHANNELS FOR SEMICONDUCTOR DEVICES

(75) Inventors: Ravi Pillarisetty, Portland, OR (US);
Mantu K. Hudait, Portland, OR (US);
Marko Radosavljevic, Beaverton, OR (US); Gilbert Dewey, Hillsboro, OR (US); Willy Rachmady, Beaverton, OR (US); Titash Rakshit, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 356 days.

(21) Appl. No.: 12/164,982

(22) Filed: Jun. 30, 2008

(65) Prior Publication Data
US 2009/0321717 A1 Dec. 31, 2009

(51) Int. Cl.
*H01L 31/072* (2006.01)

(52) U.S. Cl. ............ 257/24; 257/E21.407; 257/E29.069

(58) Field of Classification Search .................... 257/14, 257/24, 190, 192, 201, E29.069, E21.407
See application file for complete search history.

(56) References Cited

U.S. PATENT DOCUMENTS

| | | | | |
|---|---|---|---|---|
| 5,105,241 A | * | 4/1992 | Ando | 257/194 |
| 6,621,124 B2 | * | 9/2003 | Ponomarev | 257/347 |
| 6,787,821 B2 | * | 9/2004 | Minetani | 257/194 |
| 7,157,756 B2 | * | 1/2007 | Ui et al. | 257/285 |

* cited by examiner

*Primary Examiner* — Thao X Le
*Assistant Examiner* — Tanika Warrior
(74) *Attorney, Agent, or Firm* — Blakely, Sokoloff, Taylor & Zafman LLP

(57) ABSTRACT

A compositionally-graded quantum well channel for a semiconductor device is described. A semiconductor device includes a semiconductor hetero-structure disposed above a substrate and having a compositionally-graded quantum-well channel region. A gate electrode is disposed in the semiconductor hetero-structure, above the compositionally-graded quantum-well channel region. A pair of source and drain regions is disposed on either side of the gate electrode.

15 Claims, 6 Drawing Sheets

COMPOSITIONALLY-GRADED QUANTUM-WELL CHANNELS FOR SEMICONDUCTOR DEVICES

TECHNICAL FIELD

Embodiments of the invention are in the field of Semiconductor Devices and, in particular, quantum-well channels for semiconductor devices.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Quantum-well devices formed in epitaxially grown semiconductor hetero-structures, such as in III-V material systems, offer exceptionally high carrier mobility in the transistor channels due to low effective mass along with reduced impurity scattering by delta doping. These devices provide high drive current performance and appear promising for future low power, high speed logic applications.

One issue for quantum-well devices is the requirement that the quantum-well itself must be fairly thick (~150 Angstroms) in order to maintain high mobility in a quantum-well device. A thick quantum-well results in a significant distance between the interior quantum-well interface and the centroid of an electron wave-function propagated in the quantum-well. This may lead to a detrimental increase in the effective electrical oxide thickness between the gate electrode and the wave-function center. However, thinner quantum-wells suffer from mobility degradation due to increased interface scattering since the electron wave-function is much closer to both interfaces in a thin quantum-well. In addition, thinning the quantum well can degrade mobility by allowing the wave-function to penetrate into the low mobility barrier material.

DETAILED DESCRIPTION

Compositionally-graded quantum-well channels for semiconductor devices are described. In the following description, numerous specific details are set forth, such as material regimes and device characteristics, in order to provide a thorough understanding of the present invention. It will be apparent to one skilled in the art that the present invention may be practiced without these specific details. In other instances, well-known features, such as patterning processes, are not described in detail in order to not unnecessarily obscure the present invention. Furthermore, it is to be understood that the various embodiments shown in the Figures are illustrative representations and are not necessarily drawn to scale.

Disclosed herein is a compositionally-graded quantum-well channel for a semiconductor device. A semiconductor device may include a semiconductor hetero-structure disposed above a substrate and having a compositionally-graded quantum-well channel region. In an embodiment, a gate electrode is disposed in the semiconductor hetero-structure, above the compositionally-graded quantum-well channel region. A pair of source and drain regions may be disposed on either side of the gate electrode. In an embodiment, the compositionally-graded quantum-well channel region is formed by depositing a material composition by molecular-beam epitaxy to a thickness approximately in the range of 150-200 nanometers.

Short channel effects and gate length (Lg) scalability may be improved in a quantum-well device that includes a compositionally-graded quantum-well channel region. In accordance with an embodiment of the present invention, compositional grading is performed during the deposition of the quantum-well channel. In one embodiment, grading the quantum-well, to form a compositionally-graded quantum-well channel region, moves the centroid of the wave-function closer to a gate electrode disposed above the quantum-well. This may result in a significant reduction in the effective electrical oxide thickness (TOXE). In an embodiment, reducing TOXE by grading the composition of the quantum-well channel provides a significant short-channel effect (SCE) improvement in a transistor including the compositionally-graded quantum-well. In contrast to reducing TOXE by thinning the quantum-well, mobility loss in a transistor can be avoided by incorporating a compositionally-graded quantum-well channel region. Furthermore, in an embodiment, interface scattering can be significantly reduced if compositional grading, as opposed to thinning, is used to tailor the quantum-well because a wave-function propagated therein does not substantially penetrate into quantum confinement layers present in the device. Thus, in accordance with an embodiment of the present invention, a quantum-well based semiconductor device, such as a transistor, exhibits improved electrostatic control of the channel and better short channel effects, while maintaining high carrier mobility.

Figure 1:
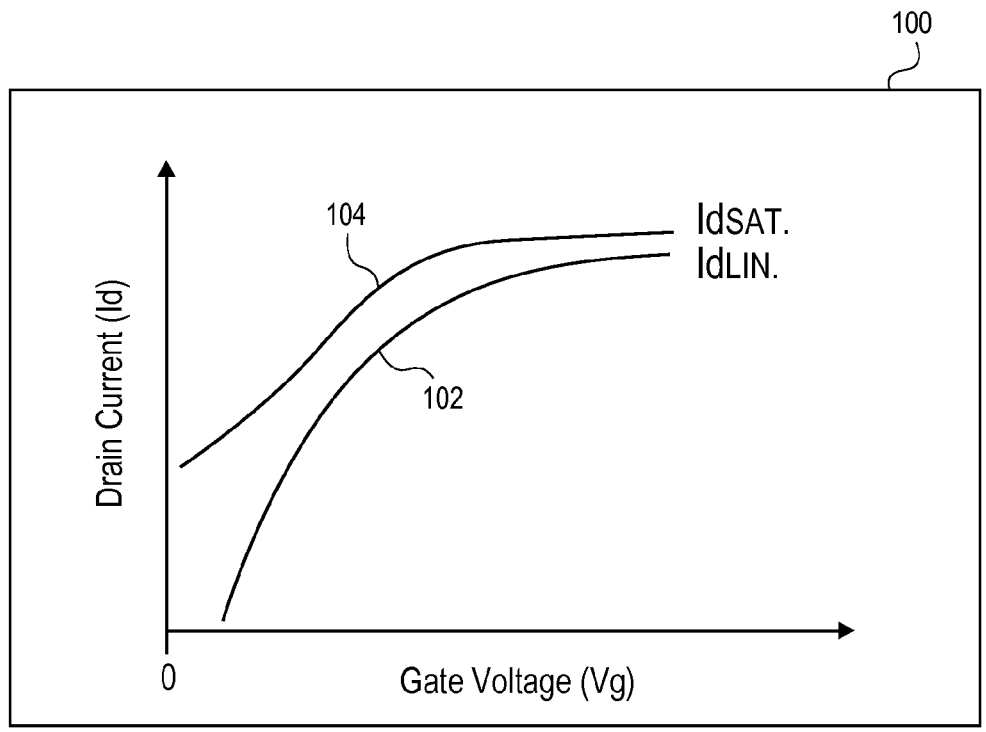
FIG. 1 is a plot of Drain Current (Id) as a function of Gate Voltage (Vg) for a conventional quantum-well semiconductor device.

Short channel effect parameters, such as off-state current (Ioff), sub-threshold slope (SSlope) and drain-induced barrier leakage (DIBL), may inhibit the performance or scaling of a conventional semiconductor device. For example, FIG. 1 is a plot 100 of Drain Current (Id) as a function of Gate Voltage (Vg) for a conventional semiconductor device. Referring to FIG. 1, a curve 102 is plotted for linear drain current ($Id_{LIN}$) and a curve 104 is plotted for saturated drain current ($Id_{SAT}$). As the gate voltage of a conventional semiconductor device approaches 0 (with respect to a reference ground state), curve 104 deflects away from curve 102. In an embodiment, the deflection of curve 102 indicates detrimental short channel effect parameters, e.g. high Ioff, low SSlope and high DIBL, for a conventional semiconductor device. For example, in one embodiment, such parameters are observed for a conventional quantum-well semiconductor device.

Figure 2:
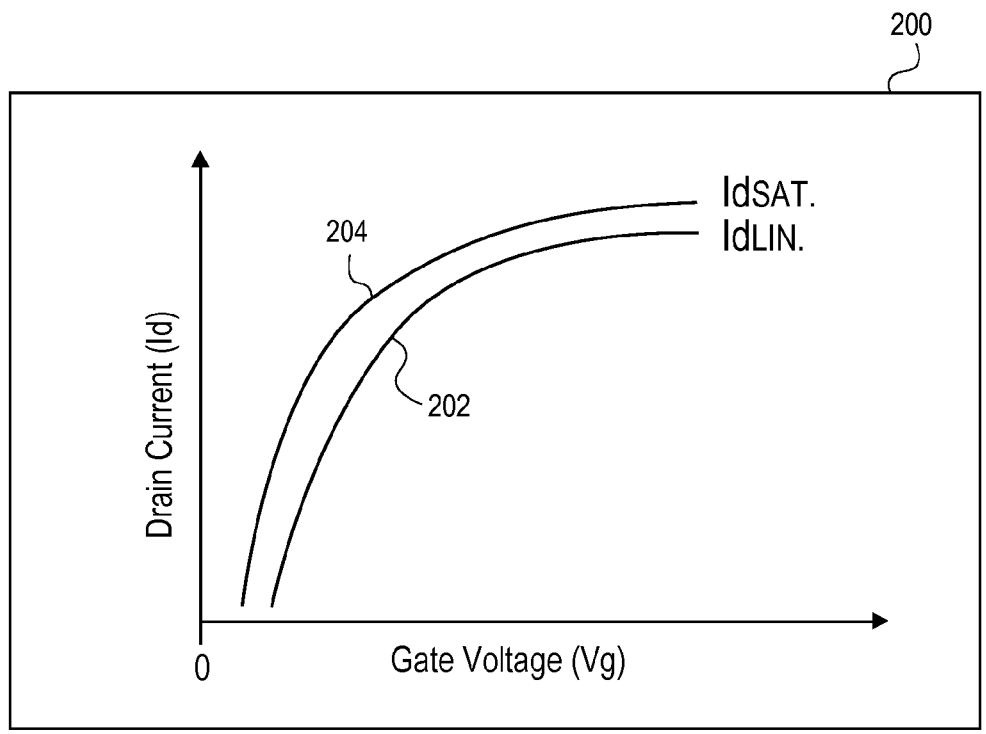
FIG. 2 is a plot of Drain Current (Id) as a function of Gate Voltage (Vg) for a quantum-well semiconductor device having a compositionally-graded quantum-well channel region, in accordance with an embodiment of the present invention.

Detrimental short channel effect parameters may be mitigated by incorporating a compositionally-graded quantum-well channel region into a semiconductor device. FIG. 2 is a plot 200 of Drain Current (Id) as a function of Gate Voltage (Vg) for a quantum-well semiconductor device having a compositionally-graded quantum-well channel region, in accordance with an embodiment of the present invention. Referring to FIG. 2, a curve 202 is plotted for linear drain current ($Id_{LIN}$) and a curve 104 is plotted for saturated drain current ($Id_{SAT}$). As the gate voltage of a quantum-well semiconductor device having a compositionally-graded quantum-well channel region approaches 0 (with respect to a reference ground state), curve 204 does not deflect away from curve 202. In an embodiment, the lack of deflection of curve 202 indicates mitigated short channel effect parameters, e.g. low Ioff, high SSlope and low DIBL, for a quantum-well semiconductor device having a compositionally-graded quantum-well channel region. In addition to mitigating detrimental off-state parameters, such as the short channel effect parameters described above, on-state parameters may also be improved by incorporating a compositionally-graded quantum-well channel region into a semiconductor device. For example, in one embodiment, a wave-function generated in the on-state is off-center in the compositionally-graded quantum-well channel region, closer to a gate electrode. This provides for better gate control, and hence improved performance, of the channel region as compared with the gate control exhibited in a conventional quantum-well semiconductor device. In one embodiment, the on-state current increases because the effective electrical oxide thickness decreases as the wave-function is moved closer to the gate electrode.

Figure 3:
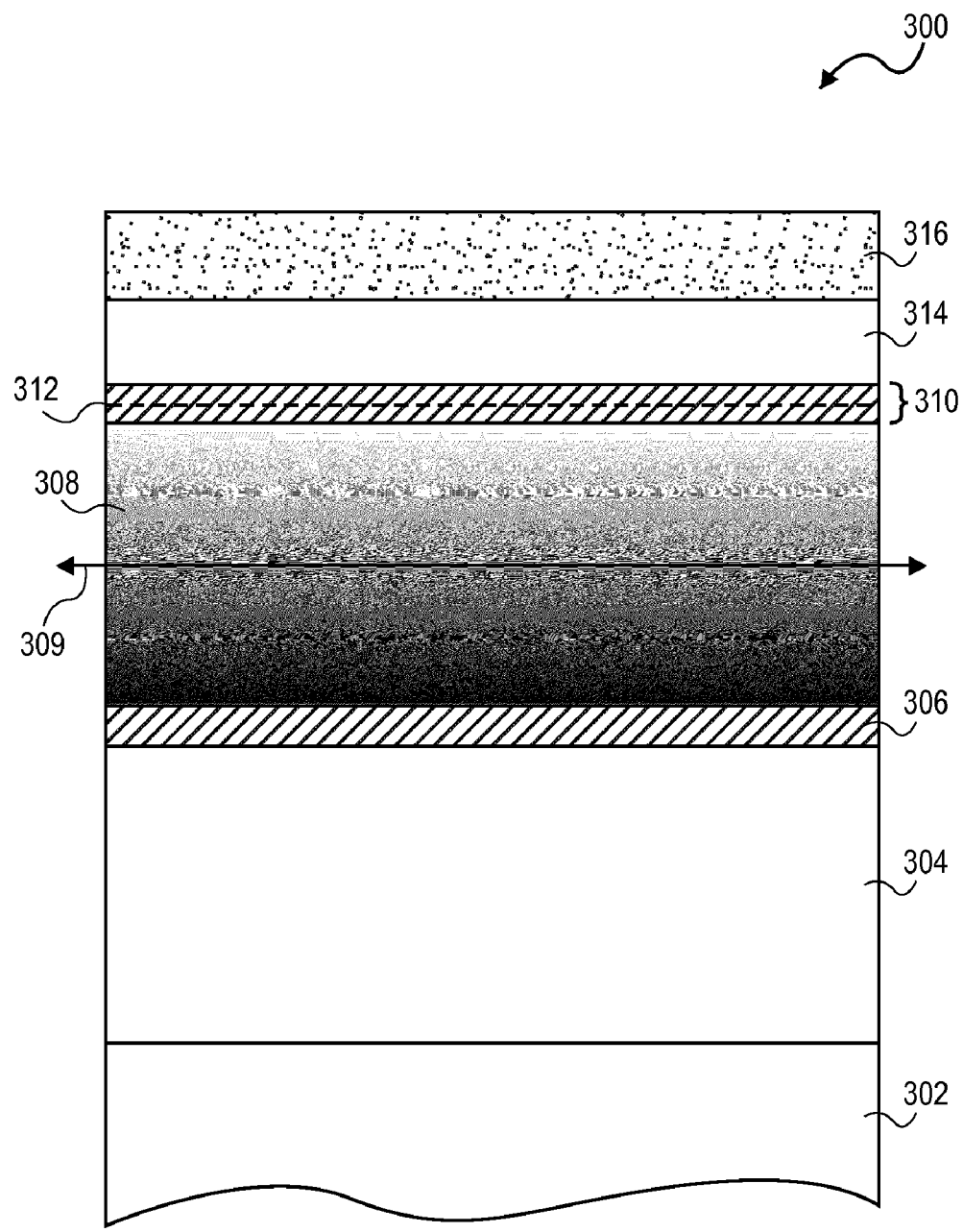
FIG. 3 illustrates a cross-sectional view of a semiconductor hetero-structure having a compositionally-graded quantum-well channel region, in accordance with an embodiment of the present invention.

In an aspect of the present invention, a compositionally-graded quantum-well channel region is included in a semiconductor hetero-structure. FIG. 3 illustrates a cross-sectional view of a semiconductor hetero-structure having a compositionally-graded quantum-well channel region, in accordance with an embodiment of the present invention. A semiconductor hetero-structure may be defined as any stack of multiple crystalline semiconductor layers. Referring to FIG. 3, a semiconductor hetero-structure 300 includes a substrate 302 having a compositional buffer layer 304 disposed thereon. A bottom barrier layer 306 is disposed above compositional buffer layer 304 and a compositionally-graded quantum-well channel region 308 is disposed on bottom barrier layer 306. A top barrier layer 310, which includes a delta-doped region 312 (depicted by the dashed lines), is disposed above compositionally-graded quantum-well channel region 308. In one embodiment, an etch-stop layer 314 is disposed above top barrier layer 310 and a charge-carrier source layer 316 is disposed above etch-stop layer 314, as depicted in FIG. 3.

Substrate 302 may be composed of a material suitable for semiconductor device fabrication. In one embodiment, substrate 302 is a bulk substrate composed of a single crystal of a material which may include, but is not limited to, silicon, germanium, silicon-germanium or a III-V compound semiconductor material. In another embodiment, substrate 302 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 302 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 302 may further include dopant impurity atoms.

Compositional buffer layer 304 may be composed of a crystalline material suitable to provide a specific lattice structure onto which a bottom barrier layer may be formed with negligible dislocations. For example, in accordance with an embodiment of the present invention, compositional buffer layer 304 is used to change, by a gradient of lattice constants, the exposed growth surface of semiconductor hetero-structure 300 from the lattice structure of substrate 302 to one that is more compatible for epitaxial growth of high quality, low defect layers thereon. In one embodiment, compositional buffer layer 304 acts to provide a more suitable lattice constant for epitxial growth instead of an incompatible lattice constant of substrate 302. In an embodiment, substrate 302 is composed of single-crystal silicon and compositional buffer layer 304 is composed of a layer of InAlAs having a thickness of approximately 1 micron. In an alternative embodiment, compositional buffer layer 304 is omitted because the lattice constant of substrate 302 is suitable for the growth of a bottom barrier layer for a quantum-well semiconductor device.

Bottom barrier layer 306 may be composed of a material suitable to confine a wave-function in a quantum-well formed thereon. In accordance with an embodiment of the present invention, bottom barrier layer 306 has a lattice constant suitably matched to the top lattice constant of compositional buffer layer 304, e.g. the lattice constants are similar enough that dislocation formation in bottom barrier layer 306 is negligible. In one embodiment, bottom barrier layer 306 is composed of a layer of approximately $In_{0.65}Al_{0.35}As$ having a thickness of approximately 10 nanometers. In a specific embodiment, the bottom barrier layer 306 composed of the layer of approximately $In_{0.65}Al_{0.35}As$ is used for quantum confinement in an N-type semiconductor device. In another embodiment, bottom barrier layer 306 is composed of a layer of approximately $In_{0.65}Al_{0.35}Sb$ having a thickness of approximately 10 nanometers. In a specific embodiment, the bottom barrier layer 306 composed of the layer of approximately $In_{0.65}Al_{0.35}Sb$ is used for quantum confinement in a P-type semiconductor device.

Compositionally-graded quantum-well channel region 308 may be composed of a material suitable to propagate a wave-function with low resistance. Furthermore, the composition of the material may change gradually in the direction from its interface with a bottom barrier layer to its interface with a top barrier layer. In accordance with an embodiment of the present invention, compositionally-graded quantum-well channel region 308 has a lattice constant suitably matched to the lattice constant of bottom barrier layer 306, e.g. the lattice constants are similar enough that dislocation formation in compositionally-graded quantum-well channel region 308 is negligible. In an embodiment, compositionally-graded quantum-well channel region 308 is composed of groups III (e.g. boron, aluminum, gallium or indium) and V (e.g. nitrogen, phosphorous, arsenic or antimony) elements. In one embodiment, compositionally-graded quantum-well channel region 308 is composed of a material composition of approximately $In_{0.7}Ga_{0.3}As$ closest to bottom barrier layer 306 that gradually grades to a material composition of approximately InAs farthest from bottom barrier layer 306. In a specific embodiment, the material composition of approximately $In_{0.7}Ga_{0.3}As$ graded to a material composition of approximately InAs provides a quantum-well for an N-type semiconductor device. In another embodiment, compositionally-graded quantum-well channel region 308 is composed of a material composition of approximately $In_{0.85}Al_{0.15}Sb$ closest to bottom barrier layer 306 that gradually grades to a material composition of approximately InSb farthest from bottom barrier layer 306. In a specific embodiment, the material composition of approximately $In_{0.85}Al_{0.15}Sb$ graded to a material composition of approximately InSb provides a quantum-well for a P-type semiconductor device. Compositionally-graded quantum-well channel region 308 may have a thickness suitable to propagate a substantial portion of a wave-function, e.g. suitable to inhibit a significant portion of the wave-function from entering bottom barrier layer 306 or a top barrier layer formed on compositionally-graded quantum-well channel region 308. In an embodiment, compositionally-graded quantum-well channel region has a thickness approximately in the range of 150-200 nanometers. In an alternative embodiment, compositionally-graded quantum-well channel region 308 is composed of a semiconductor material such as, but not limited to, a silicon-germanium semiconductor material of a II-VI semiconductor material. In another alternative embodiment, compositionally-graded quantum-well channel region 308 is a strained quantum-well region having a thickness approximately in the range of 50-100 Angstroms.

Compositionally-graded quantum-well channel region 308 may be designed to shift either the conduction band, the valence band, or both, off of the center axis 309 of compositionally-graded quantum-well channel region 308, closer to a top barrier layer formed thereon. In one embodiment, the conduction band of compositionally-graded quantum-well channel region 308 is off-center, farther away from bottom barrier layer 306 and closer to the top of semiconductor hetero-structure 300. In a specific embodiment, the conduction band is off-center to provide a quantum-well for an N-type semiconductor device. In another embodiment, the valence band of compositionally-graded quantum-well channel region 308 is off-center, farther away from bottom barrier layer 306 and closer to the top of semiconductor hetero-structure 300. In a specific embodiment, the valence band is off-center to provide a quantum-well for a P-type semiconductor device. In an embodiment, compositionally-graded quantum-well channel region 308 is composed of a material having a smaller band-gap farther away from bottom barrier layer 306 and closer to the top of semiconductor hetero-structure 300 and a larger band-gap closer to bottom barrier layer 306 and farther away from the top of semiconductor hetero-structure 300. In one embodiment, the band-gap of compositionally-graded quantum-well channel region 308 is smoothly transitioned, by varying the material composition during epitaxial growth, from the interface with bottom barrier layer 306 in the direction of the top of semiconductor hetero-structure 300.

Top barrier layer 310 may be composed of a material suitable to confine a wave-function in a quantum-well formed thereunder. In accordance with an embodiment of the present invention, top barrier layer 310 has a lattice constant suitably matched to the lattice constant of compositionally-graded quantum-well channel region 308, e.g. the lattice constants are similar enough that dislocation formation in top barrier layer 310 is negligible. In one embodiment, top barrier layer 310 is composed of a layer of approximately $In_{0.65}Al_{0.35}As$ having a thickness approximately in the range of 7-8 nanometers. In a specific embodiment, the top barrier layer 310 composed of the layer of approximately $In_{0.65}Al_{0.35}As$ is used for quantum confinement in an N-type semiconductor device. In another embodiment, top barrier layer 310 is composed of a layer of approximately $In_{0.65}Al_{0.35}Sb$ having a thickness approximately in the range of 7-8 nanometers. In a specific embodiment, the top barrier layer 310 composed of the layer of approximately $In_{0.65}Al_{0.35}Sb$ is used for quantum confinement in a P-type semiconductor device.

Top barrier layer may also include a delta-doped region therein, as a source of charge-carriers for operating a quantum-well semiconductor device. In accordance with an embodiment of the present invention, top barrier layer 310 includes delta-doped region 312, as depicted in FIG. 3. In one embodiment, delta-doped region 312 is composed of silicon atoms incorporated into in a III-V layer. In a specific embodiment, the delta-doped region 312 composed of silicon atoms incorporated into in a III-V layer is used as a source of charge-carriers for an N-type semiconductor device. In an embodiment, delta-doped region 312 is composed of beryllium or carbon atoms incorporated into in a III-V layer. In a specific embodiment, the delta-doped region 312 composed of beryllium or carbon atoms incorporated into in a III-V layer is used as a source of charge-carriers for a P-type semiconductor device. In an embodiment, delta-doped region 312 has a thickness of approximately 1 nanometer and is approximately located at the mid-point of top barrier layer 310, as depicted in FIG. 3.

Etch-stop layer 314 may be composed of a material suitable to inhibit an etch process used to pattern a subsequently formed charge-carrier source layer 316. In an embodiment, etch-stop layer 314 is composed of a material such as, but not limited to, indium phosphide. Charge-carrier source layer 316 may be composed of a material suitable to provide charge-carriers when a semiconductor device is in an on-state. In one embodiment, charge-carrier source layer 316 is composed of InGaAs incorporating N-type dopants such as, but not limited to, silicon. In a specific embodiment, the charge-carrier source layer 316 composed of InGaAs and incorporating N-type dopants is a source of charge-carriers for an N-type semiconductor device. In another embodiment, charge-carrier source layer 316 is composed of InAlSb incorporating P-type dopants such as, but not limited to, beryllium. In a specific embodiment, the charge-carrier source layer 316 composed of InAlSb and incorporating P-type dopants is a source of charge-carriers for a P-type semiconductor device.

Figure 4:
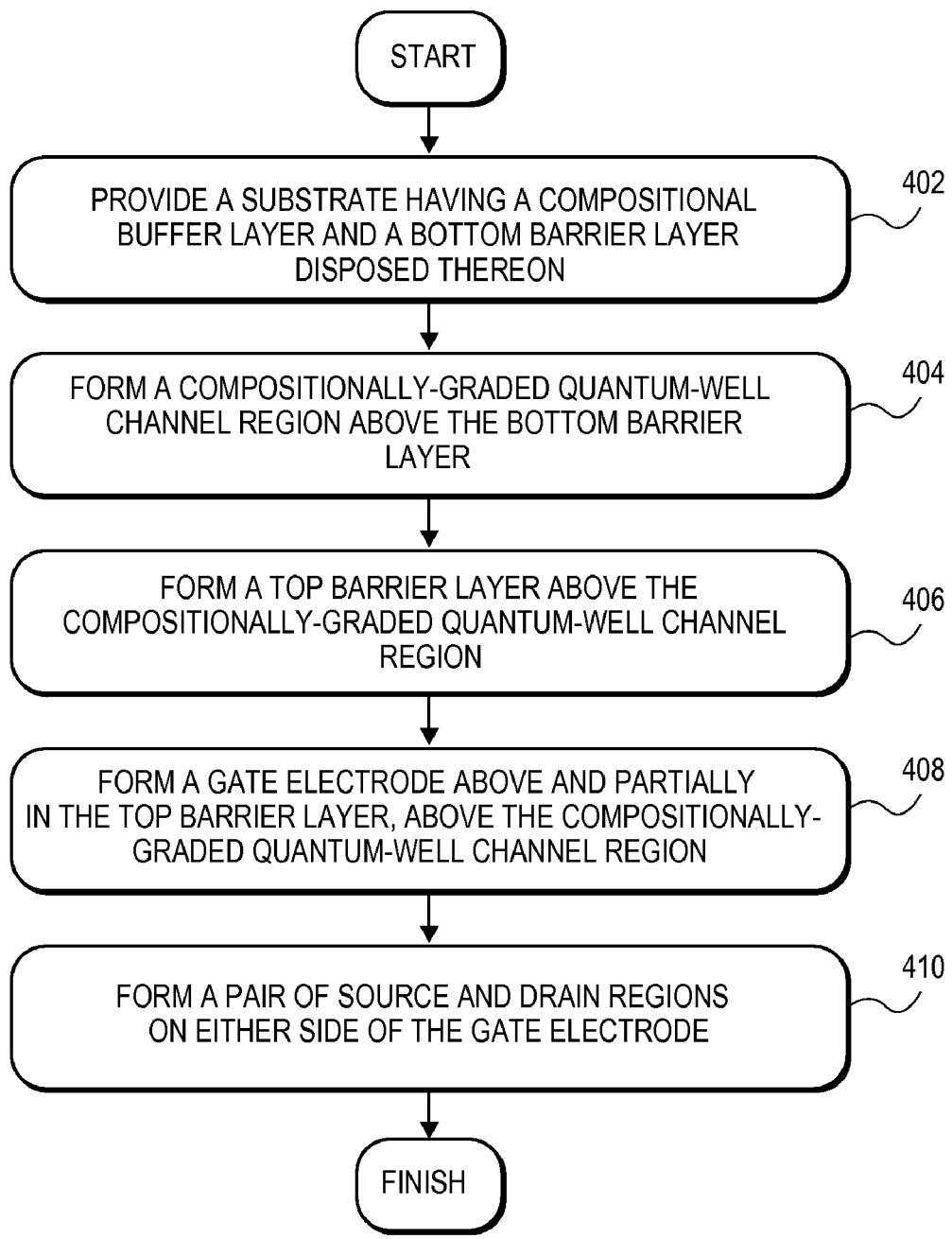
FIG. 4 is a Flowchart representing operations in the fabrication of a quantum-well semiconductor device having a compositionally-graded quantum-well channel region, in accordance with an embodiment of the present invention.

In an aspect of the present invention, a method of fabricating a quantum-well semiconductor device includes forming a compositionally-graded quantum-well channel region. FIG. 4 is a Flowchart 400 representing operations in the fabrication of a quantum-well semiconductor device having a compositionally-graded quantum-well channel region, in accordance with an embodiment of the present invention. FIGS. 5A-5D illustrate cross-sectional views representing operations in the fabrication of a quantum-well semiconductor device having a compositionally-graded quantum-well channel region, in accordance with an embodiment of the present invention.

Figure 5A:
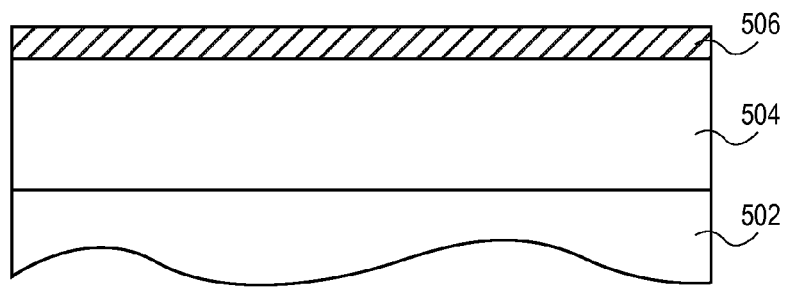
FIGS. 5A-5D illustrate cross-sectional views representing operations in the fabrication of a quantum-well semiconductor device having a compositionally-graded quantum-well channel region, in accordance with an embodiment of the present invention.

Referring to operation 402 of Flowchart 400 and corresponding FIG. 5A, a substrate 502 is provided having a compositional buffer layer 504 and a bottom barrier layer 506 disposed thereon. Substrate 502, compositional buffer layer 504 and bottom barrier layer 506 may be composed of materials such as those described in association with substrate 302, compositional buffer layer 304 and bottom barrier layer 306 from FIG. 3. In accordance with an embodiment of the present invention, compositional buffer layer 504 and bottom barrier layer 506 are deposited by a molecular-beam epitaxy technique performed on the surface of substrate 502.

Figure 5B:
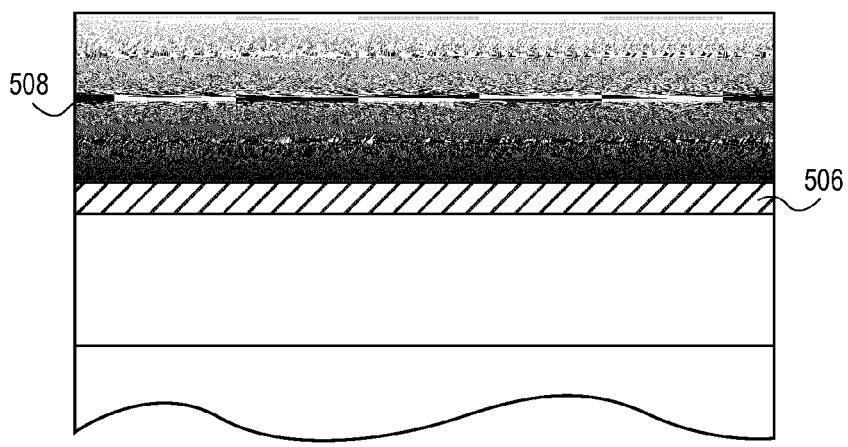

Referring to operation 404 of Flowchart 400 and corresponding FIG. 5B, a compositionally-graded quantum-well channel region 508 is formed above bottom barrier layer 506. Compositionally-graded quantum-well channel region 508 may be composed of a material selected from the materials described in association with compositionally-graded quantum-well channel region 308 from FIG. 3. In accordance with an embodiment of the present invention, the composition of compositionally-graded quantum-well channel region 508 changes gradually from its interface with bottom barrier layer 506 to its top surface. In an embodiment, compositionally-graded quantum-well channel region 508 is deposited by a molecular-beam epitaxy technique in which the ratio of the sources introduced to form compositionally-graded quantum-well channel region 508 is varied to achieve a graded region, e.g. by shutter control variation during the molecular-beam epitaxy process. In another embodiment, compositionally-graded quantum-well channel region 508 is deposited by a technique such as, but not limited to, metal-organic chemical vapor deposition or liquid phase epitaxy. In one embodiment, forming compositionally-graded quantum-well channel region 508 includes depositing groups III and V elements on bottom barrier layer 506. In a specific embodiment, forming compositionally-graded quantum-well channel region 508 includes forming a material composition of approximately $In_{0.7}Ga_{0.3}As$ closest to bottom barrier layer 506 and gradually grading to a material composition of approximately InAs farthest from bottom barrier layer 506. In another specific embodiment, forming compositionally-graded quantum-well channel region 508 includes forming a material composition of approximately $In_{0.85}Al_{0.15}Sb$ closest to bottom barrier layer 506 and gradually grading to a material composition of approximately InSb farthest from bottom barrier layer 506. In a particular embodiment, forming compositionally-graded quantum-well channel region 508 includes depositing a material composition by molecular-beam epitaxy to a thickness approximately in the range of 150-200 nanometers.

Figure 5C:
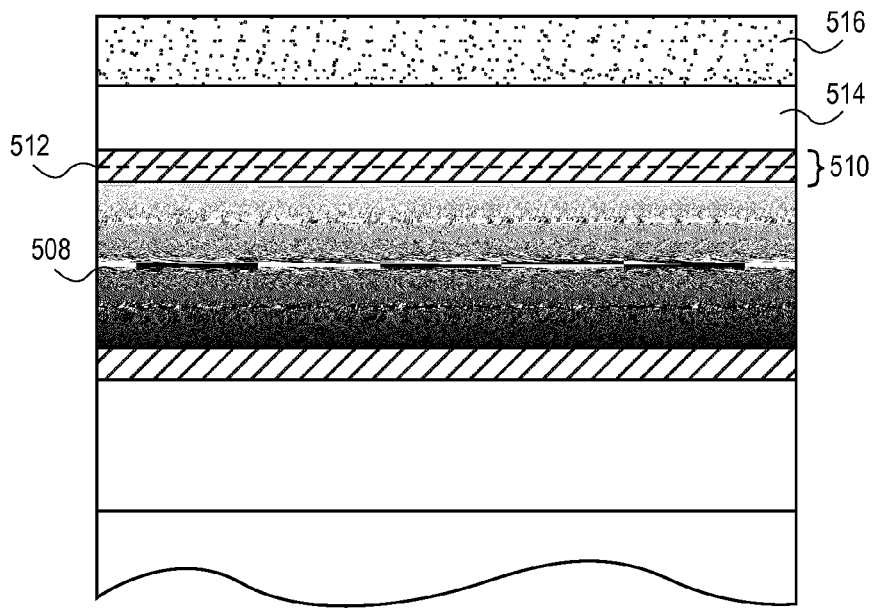

Referring to operation 406 of Flowchart 400 and corresponding FIG. 5C, a top barrier layer 510 is formed above compositionally-graded quantum-well channel region 508. Top barrier layer 510 may be composed of a material selected from the materials described in association with top barrier layer 310 from FIG. 3. In accordance with an embodiment of the present invention, top barrier layer 510 is deposited by a molecular-beam epitaxy technique performed on the surface of compositionally-graded quantum-well channel region 508. During the formation of top barrier layer 510, an additional source may briefly be introduced to provide a delta-doped region 512, as depicted in FIG. 5C. Delta-doped region 512 may be composed of a material and have a thickness and positioning in top barrier layer 510 selected from the materials, thickness and positioning described in association with delta-doped region 312 from FIG. 3. Following the formation of top barrier layer 510, an etch-stop layer 514 and a charge-carrier source layer 516 (also known in the art as a doped capping layer) may be formed. Etch-stop layer 514 and charge-carrier source layer 516 may be composed of materials such as those described in association with etch-stop layer 314 and charge-carrier source layer 316 from FIG. 3. In accordance with an embodiment of the present invention, etch-stop layer 514 and charge-carrier source layer 516 are deposited by a molecular-beam epitaxy technique performed on the surface of top barrier layer 510.

Figure 5D:
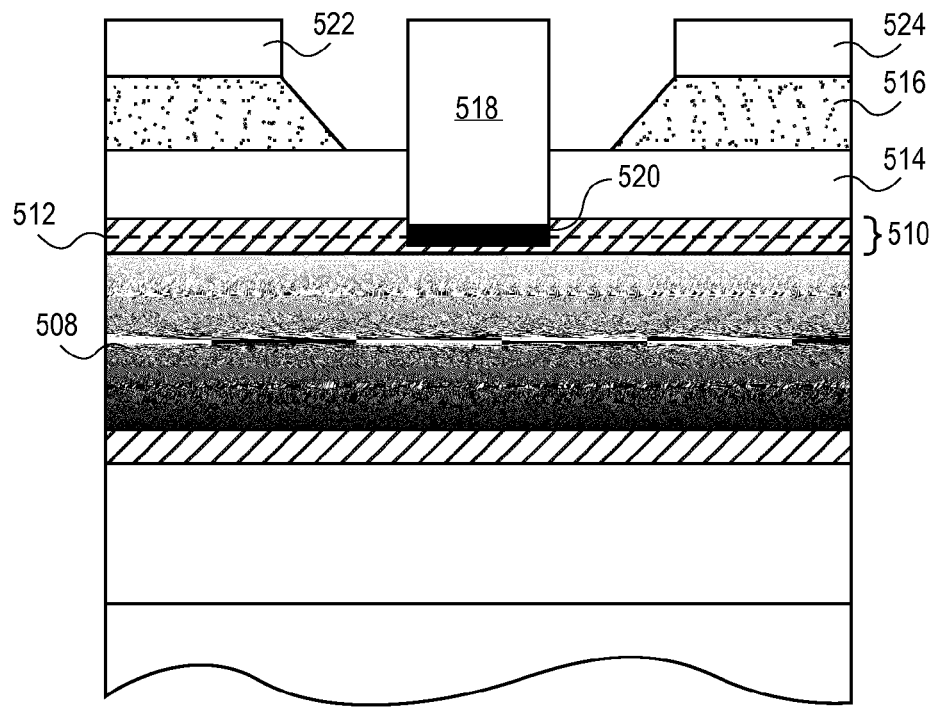

Referring to operation 408 of Flowchart 400 and corresponding FIG. 5D, a gate electrode 518 is formed above and partially in top barrier layer 510, above compositionally-graded quantum-well channel region 508. In accordance with an embodiment of the present invention, gate electrode 518 is formed by first etching charge-carrier source layer 516 using etch-stop layer 514 as an etch-stop. Then, etch-stop layer 514 and a portion of top barrier layer 510 are etched to form a cavity, and gate electrode 518 is formed in the cavity. In one embodiment, gate electrode 518 is composed of a material such as, but not limited to, a metal nitride, a metal carbide, a metal silicide, hafnium, zirconium, titanium, tantalum, aluminum, ruthenium, palladium, platinum, cobalt or nickel. In an embodiment, gate electrode 518 is part of a gate stack including a gate dielectric layer 520, as depicted in FIG. 5D. In one embodiment, gate dielectric layer 520 is composed of a material such as, but not limited to, aluminum oxide ($Al_2O_3$). In a specific embodiment, the gate stack, including gate electrode 518 and gate dielectric layer 520, is within approximately 2-3 nanometers of the top surface of compositionally-graded quantum-well channel region 508. In a particular embodiment, the gate stack, including gate electrode 518 and gate dielectric layer 520, is closer to the top surface of compositionally-graded quantum-well channel region 508 than is delta-doped region 512 and, so, a portion of delta-doped region 512 is removed during the formation of the gate stack, as depicted in FIG. 5D.

Referring to operation 410 of Flowchart 400 and again to corresponding FIG. 5D, a pair of source 522 and drain 524 regions is formed on either side of gate electrode 518. In an embodiment, source 522 and drain 524 regions are composed of a material such as, but not limited to, titanium, platinum, gold, nickel or silicon-germanium. It is to be understood that the formation of gate electrode 518 and source 522 and drain 524 regions can be performed in the opposite order from that described above, e.g. source 522 and drain 524 regions may be formed prior to forming gate electrode 518.

Figure 6:
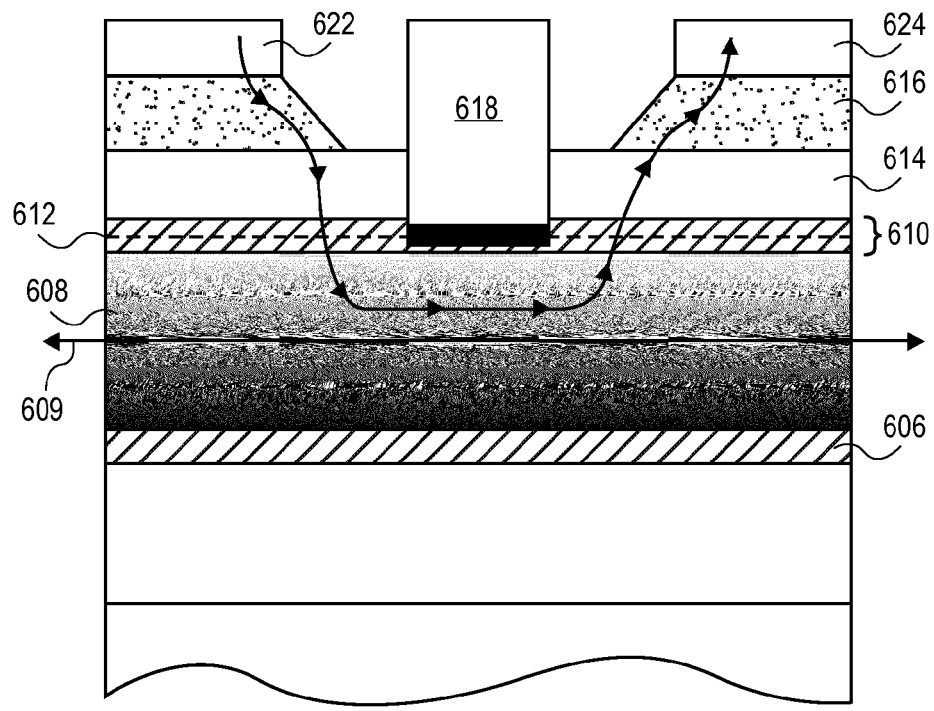
FIG. 6 illustrates a cross-sectional view representing the operation of a quantum-well semiconductor device having a compositionally-graded quantum-well channel region, in accordance with an embodiment of the present invention.

In an aspect of the present invention, a quantum-well semiconductor device having a compositionally-graded quantum-well channel region is operated in a manner that provides greater gate control as compared with a conventional quantum-well semiconductor device. FIG. 6 illustrates a cross-sectional view representing the operation of a quantum-well semiconductor device having a compositionally-graded quantum-well channel region, in accordance with an embodiment of the present invention.

Referring to FIG. 6, a quantum-well semiconductor device includes a compositionally-graded quantum-well channel region 608. A gate electrode 618 is disposed above compositionally-graded quantum-well channel region 608, and partially in a top barrier layer 610 having a delta-doped region 612 therein. An etch-stop layer 614, a charge-carrier source layer 616, and a pair of source 622 and drain 624 regions are disposed on either side of gate electrode 618. The flow of charge when the semiconductor device is in the on-state is depicted by the arrowed line starting at source 622, through compositionally-graded quantum-well channel region 608, and on to drain 624. In accordance with an embodiment of the present invention, compositionally-graded quantum-well channel region 608 is composed of groups III and V elements. In one embodiment, compositionally-graded quantum-well channel region 608 is composed of a material composition of approximately $In_{0.7}Ga_{0.3}As$ farthest from gate electrode 618, e.g. closest to a bottom barrier layer 606, that gradually grades to a material composition of approximately InAs closest to gate electrode 618. In another embodiment, compositionally-graded quantum-well channel region 608 is composed of a material composition of approximately $In_{0.85}Al_{0.15}Sb$ farthest from gate electrode 618, e.g. closest to bottom barrier layer 606, that gradually grades to a material composition of approximately InSb closest to gate electrode 618. In a specific embodiment, the conduction band of compositionally-graded quantum-well channel region 608 is off-center, closer to gate electrode 618, e.g. above center-axis 609 of compositionally-graded quantum-well channel region 608. In another specific embodiment, the valence band of compositionally-graded quantum-well channel region 608 is off-center, closer to gate electrode 618, e.g. above center-axis 609 of compositionally-graded quantum-well channel region 608. In an embodiment, both the valence band and the conduction band of compositionally-graded quantum-well channel region 608 are off-center, closer to gate electrode 618, e.g. above center-axis 609 of compositionally-graded quantum-well channel region 608.

Figure 7:
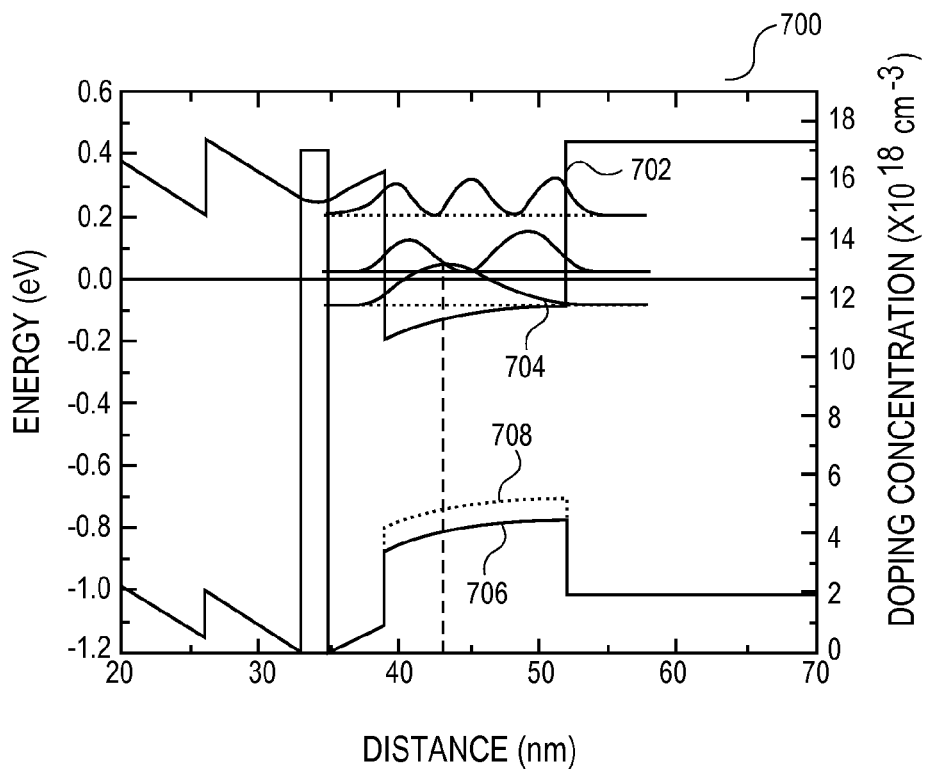
FIG. 7 is a plot of Energy (eV) as a function of Distance (nm) for wave-functions of a conventional quantum-well semiconductor device.
Figure 8:
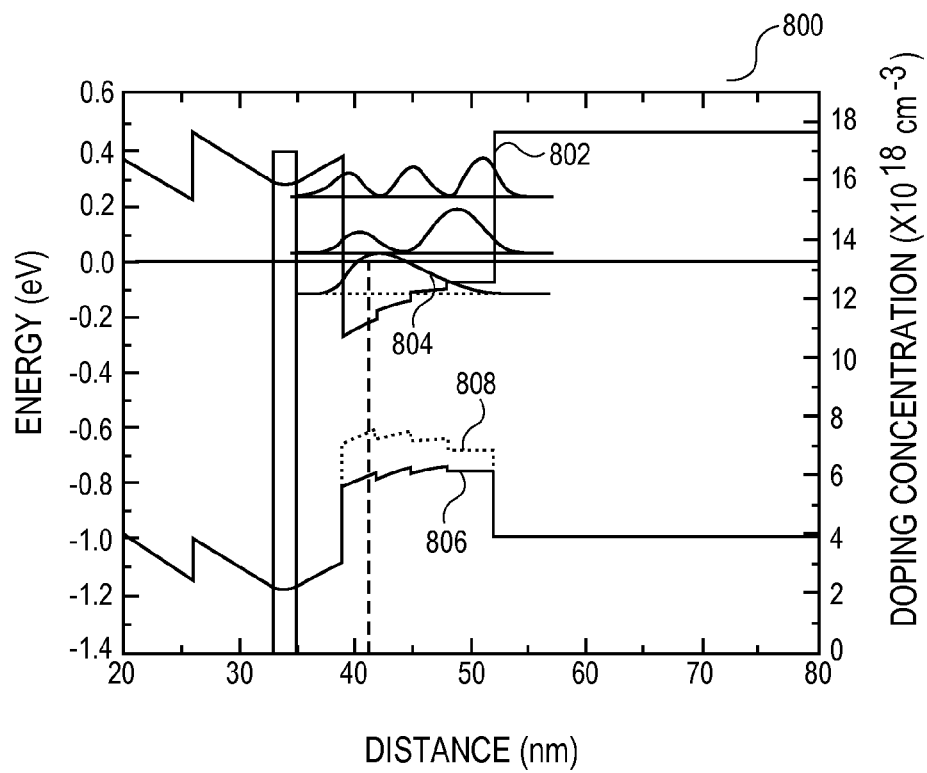
FIG. 8 is a plot of Energy (eV) as a function of Distance (nm) for wave-functions of a quantum-well semiconductor device having a compositionally-graded quantum-well channel region, in accordance with an embodiment of the present invention.

In an aspect of the present invention, by incorporating a compositionally-graded quantum-well channel region into a quantum-well semiconductor structure, the distance of a wave-function in the quantum-well may be reduced to move the wave-function closer to the gate electrode, providing better gate control for the device. FIG. 7 is a plot of Energy (eV) as a function of Distance (nm) for wave-functions of a conventional quantum-well semiconductor device. FIG. 8 is a plot of Energy (eV) as a function of Distance (nm) for wave-functions of a quantum-well semiconductor device having a compositionally-graded quantum-well channel region, in accordance with an embodiment of the present invention.

Referring to FIG. 7, an energy diagram for electrons 702 in a conventional quantum-well as a function of distance from a gate electrode is provided. Additionally, the doping concentration for the delta-doped layer is provided on the right-hand axis. A first-order wave-function 704 has a centroid (indicated by the vertical dashed line) that falls within the energy diagram for electrons 702. Furthermore, the conduction band for the conventional quantum-well is approximately centered in the energy diagram for electrons 702. It is to be understood that similar concepts apply to an energy diagram for light holes 706 and heavy holes 708, and the respective valence band, in a conventional quantum-well.

Referring to FIG. 8, an energy diagram for electrons 802 in a compositionally-graded quantum-well channel region as a function of distance from a gate electrode is provided. Additionally, the doping concentration for the delta-doped layer is provided on the right-hand axis. A first-order wave-function 804 has a centroid (indicated by the vertical dashed line) that falls within the energy diagram for electrons 802, but is shifted closer to the gate electrode than the centroid described in association with the conventional quantum-well of FIG. 7. Furthermore, the conduction band for the compositionally-graded quantum-well channel region is off-center, shifted closer to the gate electrode, in the energy diagram for electrons 802. It is to be understood that similar concepts apply to an energy diagram for light holes 806 and heavy holes 808, and the respective valence band, in a compositionally-graded quantum-well channel region. Furthermore, in accordance with an embodiment of the present invention, compositional grading of a quantum-well can reduce TOXE by shifting the centroid of the electronic wave-function.

In another aspect of the present invention, any suitable quantum-well that shifts either the valence or conduction band, or both, depending on the application, closer to a gate electrode may be incorporated to improve both the off-state and the on-state characteristics of a semiconductor device. In accordance with an embodiment of the present invention, a semiconductor device includes a semiconductor hetero-structure disposed above a substrate and having a quantum-well channel region. A gate electrode is disposed in the semiconductor hetero-structure, above the quantum-well channel region, and the conduction band of the quantum-well channel region is off-center, closer to the gate electrode. A pair of source and drain regions is disposed on either side of the gate electrode. In one embodiment, the quantum-well channel region is composed of groups III and V elements. In a specific embodiment, the quantum-well channel region is composed of indium (In), gallium (Ga), and arsenic (As) atoms. In an embodiment, the quantum-well channel region has a thickness approximately in the range of 150-200 nanometers.

In accordance with another embodiment of the present invention, a semiconductor device includes a semiconductor hetero-structure disposed above a substrate and having a quantum-well channel region. A gate electrode is disposed in the semiconductor hetero-structure, above the quantum-well channel region, and the valence band of the quantum-well channel region is off-center, closer to the gate electrode. A pair of source and drain regions is disposed on either side of the gate electrode. In one embodiment, the quantum-well channel region is composed of groups III and V elements. In a specific embodiment, the quantum-well channel region is composed of indium (In), aluminum (Al), and antimony (Sb) atoms. In an embodiment, the quantum-well channel region has a thickness approximately in the range of 150-200 nanometers.

Thus, compositionally-graded quantum-well channels for semiconductor devices have been disclosed. In an embodiment, a semiconductor device includes a semiconductor hetero-structure disposed above a substrate and having a compositionally-graded quantum-well channel region. In one embodiment, a gate electrode is disposed in the semiconductor hetero-structure, above the compositionally-graded quantum-well channel region. A pair of source and drain regions is disposed on either side of the gate electrode. In a specific embodiment, the compositionally-graded quantum-well channel region is formed by depositing a material composition by molecular-beam epitaxy to a thickness approximately in the range of 150-200 nanometers.

What is claimed is:
1. A semiconductor device, comprising:
a semiconductor hetero-structure disposed above a substrate, said semiconductor hetero-structure comprising a barrier layer disposed directly on a compositionally-graded quantum-well channel region, wherein said barrier layer comprises a delta-doped region;
a gate electrode disposed partially in said barrier layer, above said compositionally-graded quantum-well channel region;
a pair of source and drain regions disposed on either side of said gate electrode;

a gate dielectric layer disposed between a portion of said barrier layer and a portion of said gate electrode, wherein said gate dielectric layer is closer to said compositionally-graded quantum-well channel region than is said delta-doped region.

2. The semiconductor device of claim 1, wherein said compositionally-graded quantum-well channel region comprises groups III and V elements.

3. The semiconductor of claim 2, wherein said compositionally-graded quantum-well channel region comprises a material composition of approximately $In_{0.7}Ga_{0.3}As$ farthest from said gate electrode that gradually grades to a material composition of approximately InAs closest to said gate electrode.

4. The semiconductor of claim 2, wherein said compositionally-graded quantum-well channel region comprises a material composition of approximately $In_{0.85}Al_{0.15}Sb$ farthest from said gate electrode that gradually grades to a material composition of approximately InSb closest to said gate electrode.

5. The semiconductor device of claim 1, wherein said compositionally-graded quantum-well channel region has a thickness approximately in the range of 150-200 nanometers.

6. The semiconductor device of claim 1, wherein the conduction band of said compositionally-graded quantum-well channel region is off-center, closer to said gate electrode.

7. The semiconductor device of claim 1, wherein the valence band of said compositionally-graded quantum-well channel region is off-center, closer to said gate electrode.

8. A semiconductor device, comprising:
a semiconductor hetero-structure disposed above a substrate, said semiconductor hetero-structure comprising a barrier layer disposed directly on a quantum-well channel region, wherein said barrier layer comprises a delta-doped region;
a gate electrode disposed partially in said barrier layer, above said quantum-well channel region, wherein the conduction band of said quantum-well channel region is off-center, closer to said gate electrode;
a pair of source and drain regions disposed on either side of said gate electrode; and
a gate dielectric layer disposed between a portion of said barrier layer and a portion of said gate electrode, wherein said gate dielectric layer is closer to said quantum-well channel region than is said delta-doped region.

9. The semiconductor device of claim 8, wherein said quantum-well channel region comprises groups III and V elements.

10. The semiconductor device of claim 9, wherein said quantum-well channel region comprises indium (In), gallium (Ga), and arsenic (As) atoms.

11. The semiconductor device of claim 8, wherein said quantum-well channel region has a thickness approximately in the range of 150-200 nanometers.

12. A semiconductor device, comprising:
a semiconductor hetero-structure disposed above a substrate, said semiconductor hetero-structure comprising a barrier layer disposed directly on a quantum-well channel region, wherein said barrier layer comprises a delta-doped region:
a gate electrode disposed partially in said barrier layer, above said quantum-well channel, wherein the valence band of said quantum-well channel region is off-center, closer to said gate electrode;
a pair of source and drain regions disposed on either side of said gate electrode;
a gate dielectric layer disposed between a portion of said barrier layer and a portion of said gate electrode, wherein said gate dielectric layer is closer to said quantum-well channel region than is said delta-doped region.

13. The semiconductor device of claim 12, wherein said quantum-well channel region comprises groups III and V elements.

14. The semiconductor device of claim 13, wherein said quantum-well channel region comprises indium (In), aluminum (Al), and antimony (Sb) atoms.

15. The semiconductor device of claim 12, wherein said quantum-well channel region has a thickness approximately in the range of 150-200 nanometers.

* * * * *